(12) United States Patent
Zhao et al.

(10) Patent No.: US 11,735,999 B2
(45) Date of Patent: Aug. 22, 2023

(54) INVERTER HOUSING AND CONNECTING STRUCTURE FOR INVERTER AND JUNCTION BOX

(71) Applicant: Jing-Jin Electric Technologies Co., Ltd., Beijing (CN)

(72) Inventors: Xiang Zhao, Beijing (CN); Hao Zhang, Beijing (CN); Gabriel Gallegos Lopez, Beijing (CN)

(73) Assignee: JING-JIN ELECTRIC TECHNOLOGIES CO., LTD, Beijing (CN)

( * ) Notice: Subject to any disclaimer, the term of this patent is extended or adjusted under 35 U.S.C. 154(b) by 0 days.

(21) Appl. No.: 17/997,892

(22) PCT Filed: Feb. 5, 2021

(86) PCT No.: PCT/CN2021/075549
§ 371 (c)(1),
(2) Date: Nov. 3, 2022

(87) PCT Pub. No.: WO2021/244061
PCT Pub. Date: Dec. 9, 2021

(65) Prior Publication Data
US 2023/0127109 A1    Apr. 27, 2023

(30) Foreign Application Priority Data

Jun. 2, 2020    (CN) .......................... 202020979540.X

(51) Int. Cl.
*H02M 1/32* (2007.01)
*H02M 7/00* (2006.01)
*H05K 5/06* (2006.01)

(52) U.S. Cl.
CPC ............. *H02M 1/32* (2013.01); *H02M 7/003* (2013.01); *H05K 5/069* (2013.01)

(58) Field of Classification Search
CPC ......... H02M 1/32; H02M 7/003; H05K 5/069
See application file for complete search history.

(56) References Cited

U.S. PATENT DOCUMENTS

2004/0235315 A1    11/2004 Masui et al.
2011/0061705 A1*   3/2011  Croft ....................... H02S 40/34
                                                            174/59

(Continued)

FOREIGN PATENT DOCUMENTS

CN    104228709 A    12/2014
CN    110356236 A    10/2019

(Continued)

OTHER PUBLICATIONS

PCT International Search Report and Written Opinion dated Apr. 30, 2021, issued in PCT Application No. PCT/CN2021/075549.

*Primary Examiner* — Kyle J Moody
*Assistant Examiner* — Jye-June Lee
(74) *Attorney, Agent, or Firm* — ArentFox Schiff LLP

(57) ABSTRACT

An inverter casing and a connection structure of an inverter and a junction box are provided. The inverter casing includes an upper casing with an inner side that is provided with a cavity for accommodating a circuit board, and an upper surface that is provided with a junction recess for accommodating a junction box that is fixedly installed in the junction recess. Moreover, a bottom part of the junction recess is provided with an elastic protrusion for connecting a high-voltage protection device, and two incoming terminals. The elastic protrusion cooperates with a knockout pin on the junction box for high-voltage power-off protection, and the two incoming terminals are connected with external cables via the junction box.

16 Claims, 4 Drawing Sheets

(56) References Cited

U.S. PATENT DOCUMENTS

| | | | | |
|---|---|---|---|---|
| 2012/0045353 A1* | 2/2012 | Watanabe | ............ | H02M 7/003 417/410.1 |
| 2013/0049550 A1* | 2/2013 | Watanabe | ............ | H02M 7/003 310/67 R |
| 2014/0375116 A1* | 12/2014 | Deneszczuk | ............ | B60L 3/003 307/9.1 |

FOREIGN PATENT DOCUMENTS

| CN | 210606032 U | 5/2020 |
|---|---|---|
| CN | 212436067 U | 1/2021 |

\* cited by examiner

INVERTER HOUSING AND CONNECTING STRUCTURE FOR INVERTER AND JUNCTION BOX

CROSS-REFERENCE TO RELATED APPLICATIONS

This application is a National Phase of PCT/CN2021/075549, filed on Feb. 5, 2021, which claims priority to Chinese Patent Application No. 202020979540.X, filed on Jun. 2, 2020, the disclosures of each of which are hereby incorporated by reference in their entireties.

TECHNICAL FIELD

The present disclosure relates to the technical field of inverter structure, and more particularly, to an inverter casing and a connection structure of an inverter and a junction box.

BACKGROUND

In recent years, with the continuous development of power electronics, in order to meet the market demand and create technological breakthroughs, there are very strict restrictions on designing the high-voltage harness direction of the automobile inverter in the layout of the whole vehicle. In the conventional inverters, the high-voltage harness direction is single, which cannot meet the multi-directional wiring requirements and cannot realize the high-voltage protection function.

Therefore, it is necessary to provide an inverter casing which can not only meet the multi-directional wiring requirements, but also realize the high-voltage protection function.

SUMMARY

In view of the above problems, the present disclosure proposes an inverter casing and a connection structure of an inverter and a junction box to solve or partially solve the above problems.

In order to achieve the above objects, the technical solutions of the present disclosure are as follows:

An aspect of the present disclosure provides an inverter casing, wherein the inverter casing comprises an upper casing, an inner side of the upper casing is provided with a cavity for accommodating a circuit board, an upper surface of the upper casing is provided with a junction recess for accommodating a junction box, and the junction box is fixedly installed in the junction recess;

a bottom part of the junction recess is provided with an elastic protrusion, configured for connecting a high-voltage protection device, and two incoming terminals; the elastic protrusion cooperates with a knockout pin on the junction box for high-voltage power-off protection; the two incoming terminals are connected with external cables via the junction box.

Further, the junction recess has a cylindrical shape or a square shape, and the two incoming terminals are symmetrically disposed on a diameter of the cylindrical shape or a diagonal of the square shape.

Further, the bottom part of the junction recess is provided with a number of threaded holes for installing and fixing the junction box.

Further, the bottom part of the junction recess is provided with a number of positioning holes matching with positioning columns on the junction box, or the bottom part of the junction recess is provided with a number of positioning columns matching with positioning holes on the junction box.

Further, the upper surface of the upper casing is further provided with Union Jack shaped reinforcing ribs, and a central part of the Union Jack shaped reinforcing ribs is provided with a circular reinforcing bulge.

Further, the inverter casing is a cuboid as a whole, a side of the cuboid has a stepped structure, and the junction recess is disposed at an upper part of the stepped structure.

Further, the inverter casing further comprises a lower casing;

both a bottom part of the upper casing and an upper part of the lower casing are provided with edges, a number of reinforcing ribs are provided on the edges, and connection holes are provided on the reinforcing ribs.

Further, the lower casing is further thereon provided with a number of installation holes.

Another aspect of the present disclosure discloses a connection structure of an inverter and a junction box, wherein the connection structure comprises the junction box and the inverter casing according to any one of the above items;

the junction box comprises a junction box casing, a junction box cover plate and a knockout pin, one end of the knockout pin is detachably connected to the bottom part of the junction box cover plate, and the other end can abut against the elastic protrusion;

one side of the junction box casing is provided with a junction part that is connected with an external cable;

a bottom part of the junction box casing is a hollow structure and abuts against the junction recess.

Further, the junction recess is provided at an edge of the inverter casing; and the connection structure includes any of the following cases:

a connecting part of the junction box faces outwards, and the top cover of the junction box is flush with a top of the inverter casing; or the connecting part of the junction box faces inwards, and the connecting part is higher than the top of the inverter casing.

The above inverter casing has the following advantages.

In the inverter casing according to the present disclosure, the elastic protrusion of the high-voltage protection device disposed on the inverter casing cooperates with the knockout pin in the junction box, which can realize the high-voltage protection when opening the cover plate of the junction box to perform wiring, and effectively ensure the safety of operator and equipment. The inverter casing according to the present disclosure can be compatible with a variety of junction boxes, which can realize the connection between the inverter and external cables of various directions, and meet the wiring requirements of inverters in different vehicle models.

BRIEF DESCRIPTION OF DRAWINGS

By reading the detailed description of the preferred embodiments below, various other advantages and benefits will become clear to a person of ordinary skill in the art. The accompanying drawings are only used for the purpose of illustrating the preferred embodiments, and should not be considered as a limitation to the present disclosure.

Moreover, throughout the drawings, the same reference numerals are used to denote the same components. In the drawings.

Figure 1:
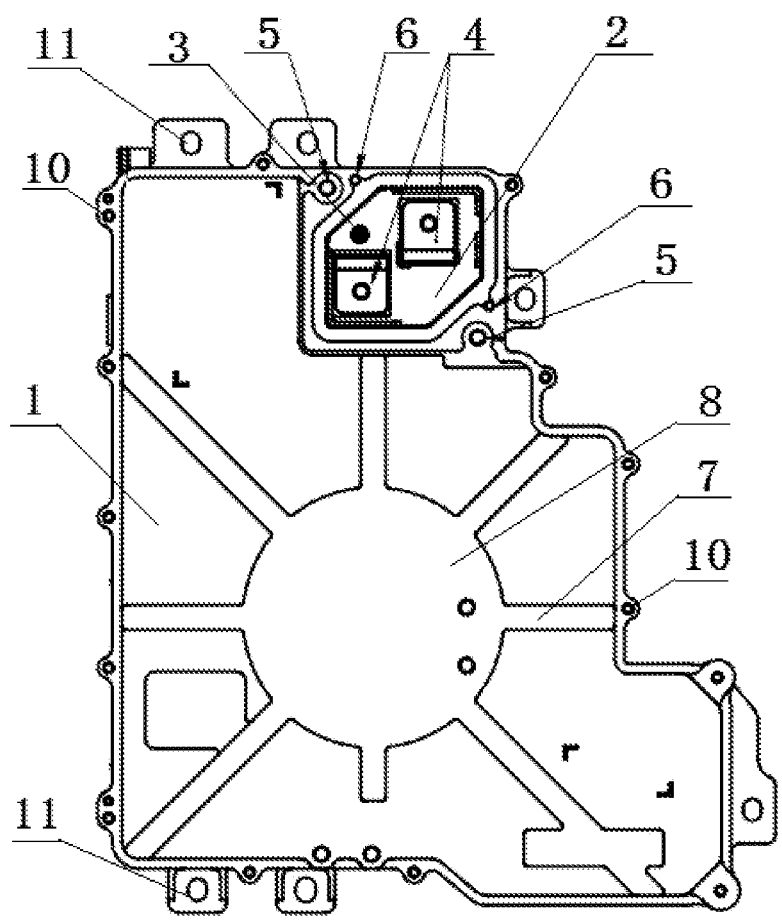
FIG. 1 is a schematic view of the structure of an inverter casing according to an embodiment of the present disclosure.

In the drawings: 1. upper casing, 2. junction recess, 3. elastic protrusion, 4. incoming terminal, 5. threaded hole, 6. positioning column, 7. Union Jack shaped reinforcing ribs, 8. reinforcing bulge, 9. lower casing, 10. connection hole, 11. installation hole, 12. junction box casing, 13. junction box cover plate, 14. knockout pin.

DETAILED DESCRIPTION

Illustrative embodiments of the present disclosure will be described in more detail with reference to the drawings. Although the drawings show the illustrative embodiments of the present disclosure, it should be understood that the present disclosure can be implemented in various ways and should not be limited by the embodiments disclosed herein. On the contrary, the embodiments are provided for a more thorough and complete understanding of the present disclosure, so as to fully convey the scope of the present disclosure to those skilled in the art.

First Embodiment

An embodiment of the present disclosure provides an inverter casing. As shown in FIG. 1, the inverter casing comprises an upper casing 1, and an inner side of the upper casing 1 is provided with a cavity for accommodating a circuit board. The cavity accommodates the circuit board and related components. The upper surface of the upper casing 1 is provided with a junction recess 2 for accommodating a junction box, and the junction box is fixedly installed in the junction recess 2.

It should be noted that the above casing may also be used for the junction of other devices, and the casing may comprise the upper casing only, and the upper casing and a mounting base form the whole casing structure; alternatively, a lower casing may be provided to cooperate with the upper casing in use. In this embodiment, the junction recess 2 may be disposed at any part of the upper casing 1, and preferably, at an edge of the upper casing 1. The bottom part of the junction recess 2 matches the bottom part of the junction box. The position of the bottom part of the junction recess 2 may be a middle position or the bottom part of the upper casing, which may be determined according to the height of the junction box and the junction position of the internal circuit board.

The bottom part of the junction recess 2 is provided with an elastic protrusion 3, configured for connecting a high-voltage protection device, and two incoming terminals 4. The main part of the high-voltage protection device is disposed in the inverter casing, and the elastic protrusion 3 is partially exposed in the junction recess 2. The elastic protrusion 3 is matched with the knockout pin 14 on the junction box for high-voltage power-off protection. When the knockout pin 14 abuts against the elastic protrusion 3, the elastic protrusion 3 is pressed down, and the high-voltage power-off protection is not triggered at this moment. When the knockout pin 14 is separated from the elastic protrusion 3, the elastic protrusion 3 pops up, and the high-voltage power-off protection is triggered at this moment. The two incoming terminals 4 are connected with an external cable via the junction box. The incoming terminals 4 are divided into a positive incoming terminal and a negative incoming terminal, which are respectively connected with the positive and negative poles of the external cable.

In the inverter casing according to the present disclosure, the elastic protrusion 3 of the high-voltage protection device disposed on the inverter casing cooperates with the knockout pin 14 in the junction box, which can realize the high-voltage power-off protection when opening the cover plate 13 of the junction box to perform junction, and effectively ensure the safety of operator and equipment. The inverter casing according to the present disclosure can be compatible with a variety of junction boxes, which can realize the connection between the inverter and external cables of various directions, and meet the wiring requirements of inverters in different vehicle models.

In an embodiment, the junction recess 2 has a cylindrical shape or a square shape, and the two incoming terminals 4 are symmetrically disposed on a diameter of the cylindrical shape or a diagonal of the square shape. The junction recess 2 may be designed into other shapes as required, such as a rectangle. The shape of the junction recess 2 is consistent with the shape of the junction box, such that it is convenient for the junction box to be assembled in the junction recess 2.

In an embodiment, as shown in FIG. 1, the bottom part of the junction box 2 is provided with a number of threaded holes 5 for installing and fixing the junction box. The position and number of threaded holes 5 may be adjusted as needed to facilitate the fixation between the junction box and the junction recess 2.

In a preferred embodiment, as shown in FIG. 1, the bottom part of the junction recess 2 is provided with a number of positioning columns 6 matching with positioning holes on the junction box. Through the engagement of the positioning columns 6 and the positioning holes, the position of the junction box can be fixed. Of course, the positions of the positioning holes and the positioning columns may also be interchanged.

Figure 2:
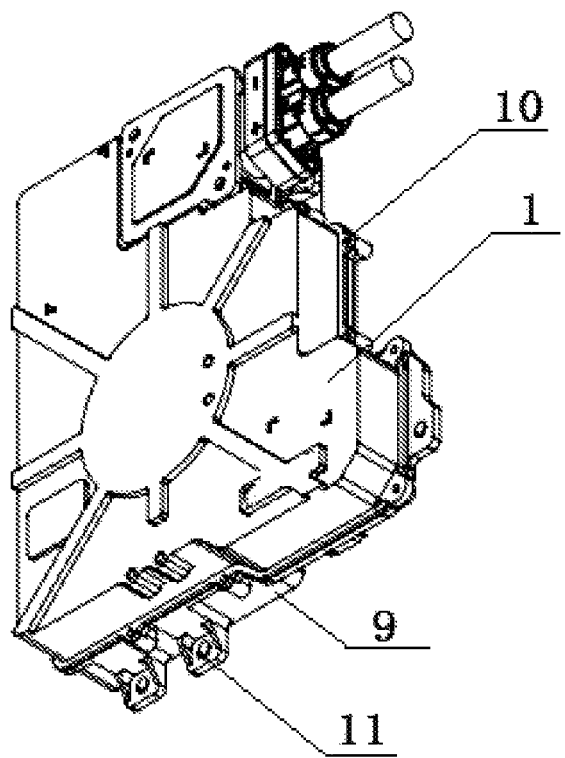
FIG. 2 is a schematic perspective view of a connection structure of an inverter and a junction box according to an embodiment of the present disclosure.
Figure 3:
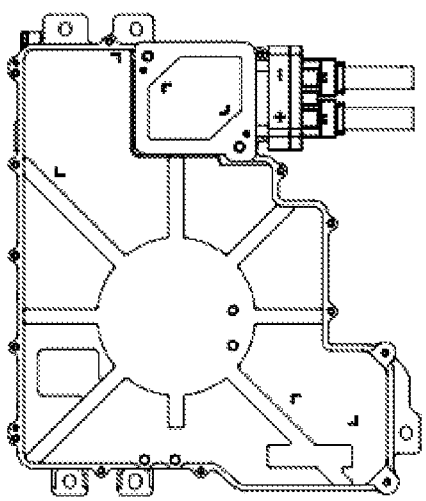
FIG. 3 is a schematic plane view of the structure of a connection structure of an inverter and a junction box according to an embodiment of the present disclosure.

In an embodiment, as shown in FIG. 1-3, an upper surface of the upper casing 1 of the inverter casing is further provided with Union Jack shaped reinforcing ribs 7, and a central part of the Union Jack shaped reinforcing ribs 7 is provided with a circular reinforcing bulge 8. The Union Jack shaped reinforcing ribs 7 and the reinforcing bulge 8 are designed to increase the strength of the inverter casing and play a supporting and strengthening role.

In an embodiment, it can be seen from FIG. 1 that the inverter casing is a cuboid as a whole, and a side of the cuboid has a stepped structure. This structure is designed to minimize the occupied space when the inverter is connected with external cables, so as to facilitate the layout of the overall structure in use. However, the shape of the inverter casing may be adjusted according to needs and internal structure, and is not limited to the above shape. The junction recess 2 is disposed at the upper part of the stepped structure, and the position of the junction recess 2 may also be adjusted as required.

In an embodiment, as shown in FIG. 2, the inverter casing further comprises a lower casing 9.

Figure 5:
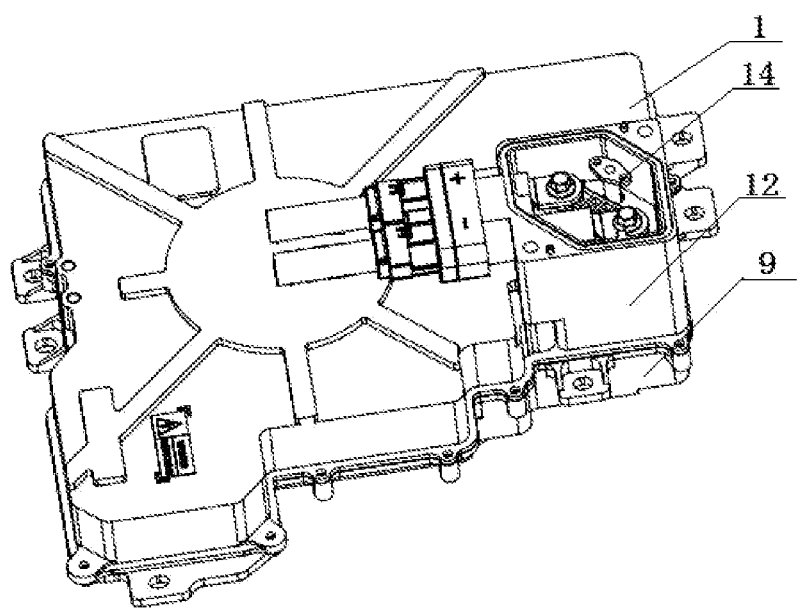
FIG. 5 is a schematic perspective view of a connection structure of an inverter and a junction box according to an embodiment of the present disclosure.

As can be seen from FIG. 2 and FIG. 5, both the bottom part of the upper casing 1 and the upper part of the lower casing 9 are provided with edges, and a number of reinforcing ribs are provided on the edges. The reinforcing ribs play a role of increasing the strength of the side parts of the inverter casing. The reinforcing ribs are provided thereon with connection holes 10. The connection and fixation between the upper casing 1 and the lower casing 9 are realized by the connection holes 10 and screws or bolts.

The junction recess 2 is not limited to the recess structure formed on the upper casing 1, and may also be a recess structure formed by a notch on the upper casing 1 and the lower casing 9 in cooperation.

In an embodiment, as shown in FIGS. 1-2, the bottom part of the lower casing 9 of the inverter is further provided with a number of installation holes 11 for installing and fixing the inverter on other devices.

Second Embodiment

This embodiment discloses a connection structure of an inverter and a junction box. The connection structure comprises the junction box and any one of the inverter casings stated above. The position relationship between the junction box and the inverter casing is shown in FIG. 2, FIG. 3, FIG. 5 and FIG. 6.

Figure 4:
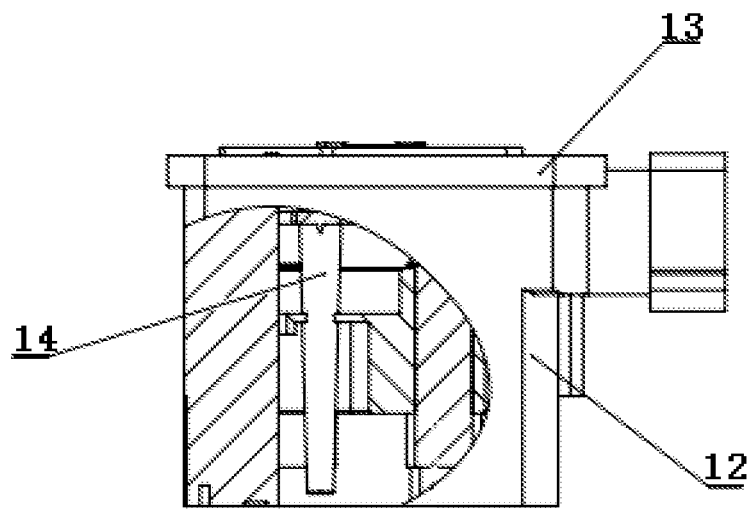
FIG. 4 is a partial sectional view of a junction box according to an embodiment of the present disclosure.

As shown in FIG. 4, the junction box comprises a junction box casing 12, a junction box cover plate 13 and a knockout pin 14. One end of knockout pin 14 is detachably connected to the bottom part of junction box cover plate 13, and the other end can abut against the elastic protrusion 3. The knockout pin 14 may be fixedly connected with the junction box cover plate 12 through screws. When the knockout pin 14 abuts against the elastic protrusion 3, high voltage power-off protection will not be triggered. When the junction box cover plate 13 is opened, since the knockout pin 14 is fixedly connected with the junction box cover plate 13, the knockout pin 14 will separate from the elastic protrusion 3, and the high-voltage power-off protection will be triggered at this moment.

One side of the junction box casing 12 is provided with a junction part, through which the connection between external cables and the interior of the junction box can be realized.

The bottom part of the junction box casing 12 is a hollow structure and abuts against the junction recess 2. The design of hollow structure facilitates the connection between the internal structure of the junction box and the inverter.

The junction direction of the junction box may be changed by providing on the junction box connection parts with different orientations or by rotating the junction box casing 12 during installation to change the orientations of connection parts.

In an embodiment, the junction recess 2 is provided at an edge of the inverter casing. The connection structure includes either of the following cases.

As shown in FIG. 2 and FIG. 3, the connection part of the junction box faces outwards, and the top cover of the junction box is flush with the top of the inverter casing. The flush design makes the connection structure of an inverter and a junction box neat, saves space, and is convenient for installation and use.

Figure 6:
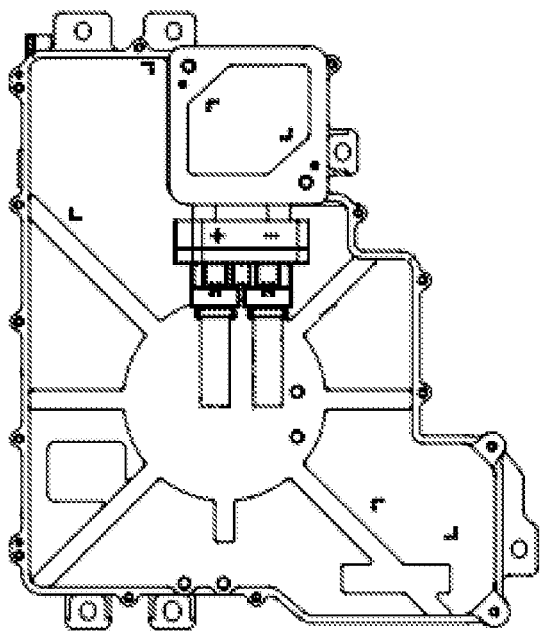
FIG. 6 is a schematic plane view of a connection structure of an inverter and a junction box according to an embodiment of the present disclosure.

As shown in FIGS. 5 and 6, the connection part of the junction box faces inwards, and the connection part is higher than the top of the inverter casing.

In the two kinds of connection structures, the connection directions between the external cables and the inverter are different, so that the inverter can be connected with cables of various directions to meet the needs of different position settings of cables.

In sum, the present disclosure discloses an inverter casing. The inverter casing comprises an upper casing, an inner side of the upper casing is provided with a cavity for accommodating a circuit board, an upper surface of the upper casing is provided with a junction recess for accommodating a junction box, and the junction box is fixedly installed in the junction recess; a bottom part of the junction recess is provided with an elastic protrusion, configured for connecting a high-voltage protection device, and two incoming terminals; the elastic protrusion cooperates with a knockout pin on the junction box for high-voltage power-off protection; the two incoming terminals are connected with external cables via the junction box. In the inverter casing according to the present disclosure, the elastic protrusion of the high-voltage protection device disposed on the inverter casing cooperates with the knockout pin in the junction box, which can realize the high-voltage protection when opening the cover plate of the junction box to perform junction, and effectively ensure the safety of operator and equipment. The inverter casing according to the present disclosure can be compatible with a variety of junction boxes, which can realize the connection between the inverter and external cables of various directions, and meet the wiring requirements of inverters in different vehicle models.

The above is only the specific embodiments of the invention. Under the above teaching of the invention, those skilled in the art can make other improvements or modifications on the basis of the above embodiments. Those skilled in the art should understand that the purpose of the above specific description is only to better explain the invention, and the protection scope of the invention should be subject to the protection scope of the claims.

What is claimed is:

1. An inverter casing, wherein the inverter casing comprises comprising:
    an upper casing including an inner side that is provided with a cavity for accommodating a circuit board, and an upper surface that is provided with a junction recess for accommodating a junction box that is fixedly installed in the junction recess;
    wherein a bottom part of the junction recess is provided with an elastic protrusion that is configured for connecting a high-voltage protection device, and two incoming terminals;
    wherein the elastic protrusion cooperates with a knockout pin on the junction box for high-voltage power-off protection; and
    wherein the two incoming terminals are connected with external cables via the junction box.

2. The inverter casing according to claim 1, wherein the junction recess has a cylindrical shape or a square shape, and the two incoming terminals are symmetrically disposed on a diameter of the cylindrical shape or a diagonal of the square shape.

3. A connection structure of an inverter comprising and the inverter casing according to claim 2, wherein:
    the junction box comprises a junction box casing and a junction box cover plate, one end of the knockout pin is detachably connected to a bottom part of the junction box cover plate, and an other end of the knockout pin is configured to abut against the elastic protrusion, one side of the junction box casing is provided with a junction part that is connected with an external cable, and a bottom part of the junction box casing is a hollow structure and abuts against the junction recess.

4. The inverter casing according to claim 1, wherein the bottom part of the junction recess is provided with a number of threaded holes for installing and fixing the junction box.

5. A connection structure of an inverter comprising the inverter casing according to claim 4, wherein:

the junction box comprises a junction box casing and a junction box cover plate, one end of the knockout pin is detachably connected to a bottom part of the junction box cover plate, and an other end of the knockout pin is configured to abut against the elastic protrusion, one side of the junction box casing is provided with a junction part that is connected with an external cable, and a bottom part of the junction box casing is a hollow structure and abuts against the junction recess.

6. The inverter casing according to claim 1, wherein the bottom part of the junction recess is provided with a number of positioning holes matching with positioning columns on the junction box, or the bottom part of the junction recess is provided with a number of positioning columns matching with positioning holes on the junction box.

7. A connection structure of an inverter comprising the inverter casing according to claim 6, wherein:

the junction box comprises a junction box casing and a junction box cover plate, one end of the knockout pin is detachably connected to a bottom part of the junction box cover plate, and an other end of the knockout pin is configured to abut against the elastic protrusion, one side of the junction box casing is provided with a junction part that is connected with an external cable, and a bottom part of the junction box casing is a hollow structure and abuts against the junction recess.

8. The inverter casing according to claim 1, wherein the upper surface of the upper casing is further provided with Union Jack shaped reinforcing ribs, and a central part of the Union Jack shaped reinforcing ribs is provided with a circular reinforcing bulge.

9. A connection structure of an inverter comprising and the inverter casing according to claim 8, wherein:

the junction box comprises a junction box casing and a junction box cover plate, one end of the knockout pin is detachably connected to a bottom part of the junction box cover plate, and an other end of the knockout pin is configured to abut against the elastic protrusion, one side of the junction box casing is provided with a junction part that is connected with an external cable, and a bottom part of the junction box casing is a hollow structure and abuts against the junction recess.

10. The inverter casing according to claim 1, wherein the inverter casing is a cuboid shape as a whole, a side of the cuboid shape has a stepped structure, and the junction recess 1s disposed at an upper part of the stepped structure.

11. A connection structure of an inverter comprising and the inverter casing according to claim 10, wherein:

the junction box comprises a junction box casing and a junction box cover plate, one end of the knockout pin is detachably connected to a bottom part of the junction box cover plate, and an other end of the knockout pin is configured to abut against the elastic protrusion, one side of the junction box casing is provided with a junction part that is connected with an external cable, and a bottom part of the junction box casing is a hollow structure and abuts against the junction recess.

12. The inverter casing according to claim 1, wherein the inverter casing further comprises a lower casing;

both a bottom part of the upper casing and an upper part of the lower casing are provided with edges, a number of reinforcing ribs are provided on the edges, and connection holes are provided on the reinforcing ribs.

13. The inverter casing according to claim 12, wherein the lower casing is further thereon provided with a number of installation holes.

14. A connection structure of an inverter comprising the inverter casing according to claim 13, wherein:

the junction box comprises a junction box casing and a junction box cover plate, one end of the knockout pin is detachably connected to the bottom part of the junction box cover plate, and an other end of the knockout pin is configured to abut against the elastic protrusion;

one side of the junction box casing is provided with a junction part that is connected with an external cable; and a bottom part of the junction box casing is a hollow structure and abuts against the junction recess.

15. The connection structure of an inverter and a junction box according to claim 14, wherein the junction recess is provided at an edge of the inverter casing; and the connection structure includes any of the following cases:

a connecting part of the junction box faces outwards, and a top of the junction box is flush with a top of the inverter casing; or a connecting part of the junction box faces inwards, and the connecting part is higher than the top of the inverter casing.

16. A connection structure of an inverter comprising the inverter casing according to claim 12, wherein:

the junction box comprises a junction box casing and a junction box cover plate, one end of the knockout pin is detachably connected to a bottom part of the junction box cover plate, and an other end of the knockout pin is configured to abut against the elastic protrusion, one side of the junction box casing is provided with a junction part that is connected with an external cable, and a bottom part of the junction box casing is a hollow structure and abuts against the junction recess.

\* \* \* \* \*